United States Patent [19]
Oh et al.

[11] Patent Number: 5,754,075
[45] Date of Patent: May 19, 1998

[54] INTEGRATED CIRCUITS INCLUDING POWER SUPPLY BOOSTERS AND METHODS OF OPERATING SAME

[75] Inventors: Seung-Cheol Oh; Hoon Choi, both of Kyungki-do, Rep. of Korea

[73] Assignee: Samsung Electronics Co., Ltd., Suwon, Rep. of Korea

[21] Appl. No.: 649,427

[22] Filed: May 16, 1996

[30] Foreign Application Priority Data

May 17, 1995 [KR] Rep. of Korea ............ 12275/1995

[51] Int. Cl.$^6$ .................................................. G05F 1/10
[52] U.S. Cl. .......................... 327/536; 327/537; 363/60
[58] Field of Search .................................. 327/534, 535, 327/536, 537, 538, 530; 363/59, 60

[56] References Cited

U.S. PATENT DOCUMENTS

| | | | |
|---|---|---|---|
| 5,448,198 | 9/1995 | Toyoshima et al. | 327/534 |
| 5,535,160 | 7/1996 | Yamaguchi et al. | 327/536 |
| 5,610,533 | 3/1997 | Arimoto et al. | 327/537 |

*Primary Examiner*—Timothy P. Callahan
*Assistant Examiner*—Jung Ho Kim
*Attorney, Agent, or Firm*—Myers Bigel Sibley & Sajovec

[57] ABSTRACT

An integrated circuit provides a power supply voltage, a first boosted voltage, and a second boosted voltage which is preferably equal to or greater than the first boosted voltage, to the integrated circuit transistors, such that the integrated circuit transistors operate using the power supply voltage, the first boosted voltage and the second boosted voltage. The integrated circuit includes a first boosting circuit which boosts the power supply voltage to a first boosted voltage and a second boosting circuit which boosts the power supply voltage to a second boosted voltage. The first boosting circuit is preferably responsive to application of the power supply voltage to the integrated circuit and the second boosting circuit is preferably responsive to application of the power supply voltage to the integrated circuit and to an enable signal. Preferably, the first boosting circuit applies the first boosted voltage to the bulk region of selected PMOS transistors in the integrated circuit and the second boosting circuit applies the second boosting voltage to the source regions of selected PMOS transistors. In one embodiment, the first and second boosted voltages are applied to the word line driver of an integrated circuit memory device such that the second boosted voltage is applied to the source of the word line driver PMOS transistors in response to a row address strobe signal. High speed operations are thereby provided with reduced susceptibility to bridging defect errors.

23 Claims, 2 Drawing Sheets

INTEGRATED CIRCUITS INCLUDING POWER SUPPLY BOOSTERS AND METHODS OF OPERATING SAME

FIELD OF THE INVENTION

This invention relates to integrated circuit devices such as memory devices and methods of operating same, and more particularly to integrated circuits which operate using a power supply voltage and a boosted power supply voltage, and methods of operating same.

BACKGROUND OF THE INVENTION

As the integration density of semiconductor integrated circuits continues to advance, the power supply voltages for the integrated circuits have been reduced. For example, a 4 megabit dynamic Random Access Memory (RAM) typically uses a power supply voltage of 5 volts, but a 16 megabit dynamic RAM generally employs power supply voltages of about 4 volts. Moreover, for a 64 megabit dynamic RAM, the power supply voltage has been reduced to about 3.3 volts.

When the power supply voltage to an integrated circuit is reduced, it becomes more difficult to operate the integrated circuit at high speeds. In order to provide high speed operation, it is known to include a boosting circuit in an integrated circuit such as an integrated circuit memory device.

The boosting circuit boosts the operating voltage of the integrated circuit to a boosted level which is higher than the power supply voltage.

Referring now to FIG. 1, a known boosting circuit for an integrated circuit is illustrated. The boosting circuit includes an oscillator 12, a booster 14, a transferror 16, and a detector 18. The boosting circuit generates a boosted power supply voltage VPP having a higher level than the power supply voltage applied from external to the integrated circuit.

The boosted power supply voltage VPP may be used to power a word line driver and/or a data output buffer in a high-density dynamic RAM. The word line driver drives the word line at the level of the boosted power supply voltage VPP, and the data output buffer uses the boosted power supply voltage VPP in order to prevent loss of data due to a voltage drop during read or write operations. In particular, in order to sense data in a memory cell using a bit line sense amplifier having an NMOS sense amplifier and a PMOS sense amplifier, the boosted power supply voltage VPP is provided to a control electrode of an N-type isolation transistor whose channel is connected to the bit line, so that two adjacent memory cell arrays can share the bit line sense amplifier. A decreased bit line sensing margin is thereby produced, compared to when the power supply voltage $V_{CC}$ is provided to the control electrode of the insolation transistor.

FIG. 2 is a timing diagram for the boosting circuit of FIG. 1. Referring to FIG. 2, operation of the boosting circuit of FIG. 1 according to prior art will be described.

As shown in FIG. 2, if the power supply voltage $V_{CC}$ is applied to the integrated circuit, the oscillator 12 of FIG. 1 oscillates a clock at a predetermined period, and provides the oscillated clock to an input terminal of an inverter 20 in the booster 14. The oscillator signal output is at the same level as the power supply voltage $V_{CC}$. Accordingly, when the output level of the oscillator 12 is at ground voltage $V_{SS}$, the level of a connection node N1 of a MOS capacitor 24 (hereinafter referred to as a "capacitor") connected to an output terminal of an inverter 22 which is serially connected to inverter 20, goes to "0" volt, as shown in FIG. 2. Thus, the voltage level of a connection node N2 within the booster 14 is precharged to the level of "$V_{CC}-V_{th}$", obtained by subtracting the threshold voltage $V_{th}$ of the transistor 26 from the power supply voltage $V_{CC}$.

When the level of the oscillator signal changes to the power supply voltage $V_{CC}$ from "0" volt, the connection node N1 of the booster 14 is raised to the power supply voltage $V_{CC}$ from "0" volt. Accordingly, the voltage of the connection node N2 between the capacitor 24 of the booster 14 and the transistor 26 is boosted to a level of "$2V_{CC}-V_{th}$", from the level of "$V_{CC}-V_{th}$". The boosted power supply voltage of the connection node N2 ($2V_{CC}-V_{th}$) is transmitted through a transmission transistor 28. Accordingly, the level of the boosted power supply voltage VPP, as shown in FIG. 2, is boosted to a voltage of 2 ($V_{CC}-V_{th}$) from a level of $V_{CC}-2V_{th}$ through the above continuous operation.

As shown in FIG. 2, if the oscillator 12 of FIG. 1 performs continuous oscillations, the level of the boosted power supply voltage VPP may continuously rise. Accordingly, the level of the boosted power supply voltage VPP is sensed by the detector 18, which connected between the oscillator 12 and the boosted power supply voltage VPP. The detector 18 detects when the boosted power supply voltage VPP exceeds a preset reference level, and then generates a signal to disable the oscillator 12. Thus, if the boosted power supply voltage VPP is higher than the preset level, the operation of the oscillator 12 is stopped by the disable signal output from the detector 18, and the level of the boosted power supply voltage VPP is lowered thereby.

In an integrated circuit memory, the boosted power supply voltage VPP generated in FIG. 1 may be provided to a word line driver, to a data output buffer, and/or to a control electrode of an isolation transistor. For example, FIG. 3 is a diagram illustrating a word line driver for driving a word line selection signal output from a row decoder 30 in an integrated circuit memory. The word line driver is operated from the boosted power supply voltage VPP generated from a boosting circuit such as illustrated in FIG. 1. The boosted power supply voltage VPP is provided to each of sources of first to third PMOS transistors 34, 38, and 40, and to a backbias terminal, i.e., a bulk bias terminal 44. The drain of the first PMOS transistor 34 is connected to that of a first NMOS transistor 36 through an internal node 46. Gates of the first PMOS transistor 34 and the first NMOS transistor 36 are commonly connected to an output terminal of the row decoder 30.

Still referring to FIG. 3, the drain of the third PMOS transistor 40 is coupled to the drain of the second NMOS transistor 42 through an output node 48, and the gates of the third PMOS transistor 40 and the second NMOS transistor 42 are commonly connected to the internal node 46. The source and drain of the second PMOS transistor 38 are connected to the boosted power supply voltage VPP and the internal node 46, respectively, and its gate is coupled to the output node 48. Accordingly, first PMOS transistor 34 and the first NMOS transistor 36 form a first inverter, and the third PMOS transistor 40 and the second NMOS transistor 42 form a second inverter. The first to third PMOS transistors 34, 38, and 40 have their sources and drains arranged within an N-type well formed on a P-type substrate.

In the word line driver of FIG. 3, if a word line selection signal at the active state, for example at logic "high" level, is output from the row decoder 30, the signal is provided to the gates of the first PMOS transistor 34 and the first NMOS transistor 36. The level of the word line selection signal output from the row decoder 30 is the same as that of the internal power supply voltage VCC. This level is lower than the boosted power supply voltage VPP. The first PMOS transistor 34 and the first NMOS transistor 36 are turned off and turned on, respectively, by the word line selection signal which is input to the gates thereof. Hence, the potential of the internal node 46 falls to the "low" level. When the potential of the internal node 46 is at the "low" level, the third PMOS transistor 40 and the second NMOS transistor 42 input this potential to their gates, and are turned on and turned off, respectively. Accordingly, the output node 48 is raised to the boosted voltage VPP, which is applied to the source of the third PMOS transistor 40. The word line WL is thus enabled at the boosted power supply voltage VPP.

The second PMOS transistor 38, the source and drain of which are coupled between the boosted power supply voltage VPP and the internal node 46, is turned on when the level of the output node 48 is at the logic "low" level, and thus charges the internal node 46 to the boosted power supply voltage VPP. Moreover, the second PMOS transistor 38 provides the boosted power supply voltage VPP to the gate of the second NMOS transistor 42. Thus, the time to deactivate the output node 48 is reduced.

An integrated circuit chip such as an integrated circuit memory typically includes many PMOS transistors which are operated by the boosted power supply voltage VPP from the boosting circuit of FIG. 1. The boosted power supply voltage VPP is generally applied to the sources of the PMOS transistors. However, if the boosted power supply voltage is provided to both the bulk bias terminal and the source terminal of PMOS transistors, the following problems may arise:

First, the capacitance of an N-type well capacitor can be very large. The N-type well capacitor is connected, in a bulk bias, with the PN junction of the source terminal of a PMOS transistor which is connected to the boosted power supply voltage VPP. Thus, when the boosted power supply voltage VPP is provided by the boosting circuit of FIG. 1, it may become difficult to drive the output of the booster 14 to the level of the boosted power supply voltage VPP when the oscillator 12 cycles once, as shown in the timing diagram of FIG. 2, due to the large capacitance. Therefore, oscillation outputs of several tens of times may be required to drive the output to the desired level. Excessive time may thus be required to boost the power supply voltage $V_{CC}$ to the desired level. This can reduce the access time in an integrated semiconductor memory device.

Moreover, when the integrated circuit memory device is in standby mode, if there are many nodes which must be precharged to the level of the boosted power supply voltage VPP, other problems may arise. For example, if a bridge occurs between a voltage node (or line) and the ground voltage $V_{SS}$, and the node (or line) is precharged to the power supply voltage or the reference potential, a potential distribution may be generated in the bridge area, and the level of the boosted power supply voltage VPP output from the boosting circuit may be lowered. Further, since the detector 18 detects the level of the boosted power supply voltage VPP to operate the oscillator 12, the boosting operation of the boosting circuit may be continuously performed due to the potential distribution, and the current consumption may thereby increase.

Finally, if a micro bridge occurs between the boosted power supply voltage VPP and another power supply voltage, it is difficult for the boosted power supply voltage VPP to arrive at the intended level. Thus, the voltage level of the word line may be at less than the desired level when a memory cell is accessed, and the access operation may not be performed properly.

SUMMARY OF THE INVENTION

It is therefore an object of the present invention to provide improved integrated circuits including power supply boosting and methods of operating the same.

It is another object of the present invention to provide an improved integrated circuit memory devices and methods of operating same.

It is still another object of the invention to provide integrated circuits such as integrated circuit memory devices, which reduce potential distribution between nodes and reduce current consumption during standby mode, notwithstanding the presence of a microbridge between nodes having voltage levels which are different from one another.

These and other objects are provided, according to the present invention, by integrated circuits which provide a power supply voltage, a first boosted voltage, and a second boosted voltage which is preferably greater than the first boosted voltage, to the integrated circuit transistors such that the integrated circuit transistors operate using the power supply voltage, the first boosted voltage and the second boosted voltage. In particular, integrated circuits according to the invention include means for providing a power supply voltage to at least one of the integrated circuit transistors. The integrated circuits also include first means for boosting the power supply voltage to a first boosted voltage and for applying the first boosted voltage to at least one of the integrated circuit transistors. The integrated circuits also include second means for boosting the power supply voltage to a second boosted voltage which is preferably greater than the first boosted voltage, and for applying the second boosted voltage to at least one of the integrated circuit transistors.

Preferably, the first boosting means is responsive to application of the power supply voltage to the integrated circuit such that the first boosted voltage is generated upon application of the power supply voltage to the integrated circuit. Also preferably, the second boosting means is responsive to application of the power supply voltage to the integrated circuit and to an enable signal, such that the second boosted voltage is only generated upon application of the power supply voltage and the enable signal to the integrated circuit. Also preferably, the integrated circuit transistors include at least one PMOS transistor. The first boosting means applies the first boosted voltage to the bulk region of the PMOS transistor and the second boosting means applies the second boosting voltage to the source region to the PMOS transistor.

The first boosting means may be implemented by a conventional boosting circuit as described with respect to FIGS. 1–3, including a capacitor. The second boosting means preferably includes a pair of capacitors. The second boosting means may comprise a first field effect transistor, a second field effect transistor, a first capacitor and a second capacitor. The first field effect transistor is serially connected between the power supply voltage and the first capacitor, and the second field effect transistor is serially connected between the power supply voltage and second capacitor. The first field effect transistor and the first capacitor define a first node therebetween and the second field effect transistor and the second capacitor define a second node therebetween. A third field effect transistor has a controlling electrode which is connected to the first node. One of the controlled electrodes is connected to the second node and the other of the controlled electrodes produces a second boosted voltage.

The first boosting means and the second boosting means may be used in an integrated circuit memory devices wherein the integrated circuit transistors form a plurality of memory cells and a word line driver. The power supply voltage is supplied to the memory cells and the first and second boosted voltages are supplied to the word line driver. Preferably, the word line driver includes a plurality of NMOS transistors and a plurality of PMOS transistors. The first boosted voltage is applied to the bulk regions of the PMOS transistors and the second boosted voltage is applied to the source regions of the PMOS transistors. A high performance memory which is less susceptible to bridging fault defects is thereby provided.

A preferred embodiment of an integrated circuit power supply boosting circuit which produces the second boosted voltage, according to the present invention, includes first and second precharge nodes and a boosted output node. A precharger precharges each of the first and second precharge nodes and the boosted output node, by applying the power supply voltage to the first and second precharge nodes and the boosted output node, and terminates precharging of the first and second precharge nodes from the power supply voltage in response to a control signal. The boosting circuit also includes a transferror which transfers the voltage on the second precharge node to the boosted output node in response to the voltage on the first precharge node. The boosting circuit also includes a booster which boosts the voltages on the first and second precharge nodes to a boosted level which is higher than the power supply voltage, in response to the control signal, such that the transferror transfers the boosted level to the boosted output node in response to the control signal.

The booster preferably includes a first boost driver and a first boost capacitor serially connected between the control signal and the first precharge node, and a second boost driver and a second boost capacitor serially connected between the control signal and the second precharge node. The precharger preferably comprises first, second and third switches, a respective one of which is serially connected between the power supply voltage and a respective one of the first precharge node, the second precharge node and the boosted output node, to thereby connect the first precharge node, the second precharge node and the boosted output node to the power supply voltage in the absence of the control signal, and to disconnect the first precharge node, the second precharge node and the boosted output node from the power supply voltage in the presence of the control signal. The first, second and third switches preferably are a first, second and third NMOS transistor, the drains of which are connected to the power supply voltage, the gates of which are connected to the control signal and the sources of which are connected to the first precharge node, the second precharge node and the boosted output node respectively. The transferror preferably comprises an NMOS transistor having a source and a drain which are serially connected between the second precharge node and the boosted output node, and a gate which is connected to the first precharge node.

When the boosting circuit is used in an integrated circuit memory device, the second boosting means is responsive to application of the power supply voltage to the integrated circuit and to a row address strobe signal, such that the second boosted voltage is only generated upon application of the power supply voltage and the row address strobe signal to the integrated circuit. The integrated circuit memory may also include control signal generating means, which is responsive to the row address strobe signal, to provide a control signal to the second boosting means. The control signal generating means may include a row address strobe input buffer which generates a clock signal in response to the row address strobe signal and which generates a row address enable signal a predetermined time after the clock signal is generated. A logic gate such as NOR gate may combine a clock signal and the row address enable signal to generate the control signal.

According to the invention, an integrated circuit having a plurality of PMOS transistors thereon is operated by applying a power supply voltage to the integrated circuit and generating a first boosted voltage in the integrated circuit in response to application of the power supply voltage thereto. The first boosted voltage is applied to the bulk bias of at least some of the PMOS transistors in the integrated circuit. A second boosted voltage is generated in the integrated circuit in response to an enable signal. The second boosted voltage is applied to the sources of at least some of the PMOS transistors. When the integrated circuit device is an integrated circuit memory device, and the PMOS transistors form a word line driver for the memory device, the second boosted voltage is preferably generated in response to a row address strobe signal. The second boosted voltage is preferably equal to or greater than the first boosted voltage. High speed operations are thereby provided with reduced susceptibility to bridging defect errors.

DETAILED DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

The present invention provides a boosting circuit which boosts a power supply voltage in response to an external control signal. Integrated circuits such as memory devices thereby may obtain an improved yield by reducing potential distribution within the device. A first boosting circuit boosts the power supply voltage and a second boosting circuit boosts the power supply voltage, in response to the external control signal. An integrated circuit memory device generally includes peripheral circuits having PMOS transistors. The first boosted voltage is applied to the bulk terminal, and the second boosted voltage is applied to the source terminal of at least one of the PMOS transistors. Potential distribution between nodes and current consumption during standby mode are thereby reduced, even in the presence of a bridge between nodes having different voltage levels.

Figure 1:
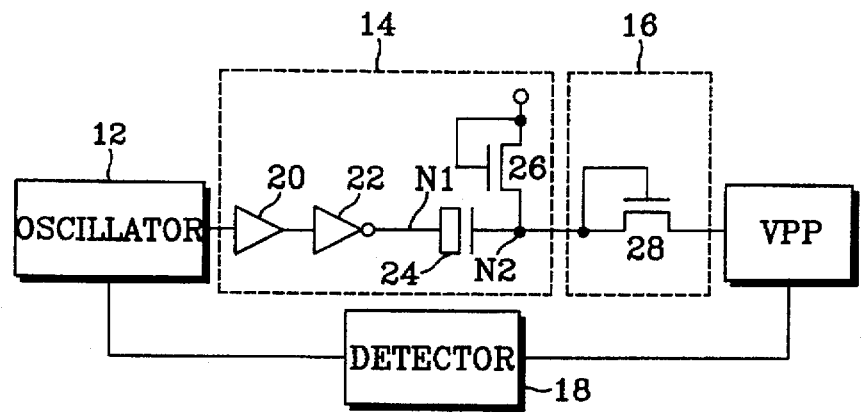
FIG. 1 is a diagram illustrating a boosting circuit according to the prior art.
Figure 2:
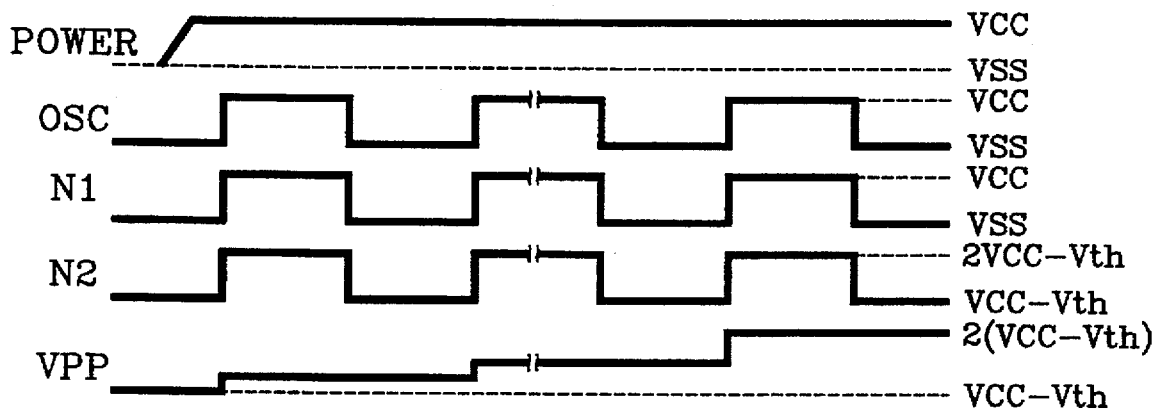
FIG. 2 is an operating timing diagram of a boosting circuit shown in FIG. 1.

According to the present invention, when the power supply voltage is applied to the integrated circuit memory device, the first boosting circuit of FIG. 1 generates the first boosted voltage VPP. The first boosted voltage VPP is provided to the bulk bias terminal of the PMOS transistor of the peripheral circuit which operates at a higher voltage than the power supply voltage. If a control signal to access a memory cell is input from external to the integrated circuit, a second boosting circuit, described in detail below, boosts the external power supply voltage to a second boosted voltage AVPP, and provides the second boosted voltage to the source terminal of the PMOS transistor.

Figure 4:
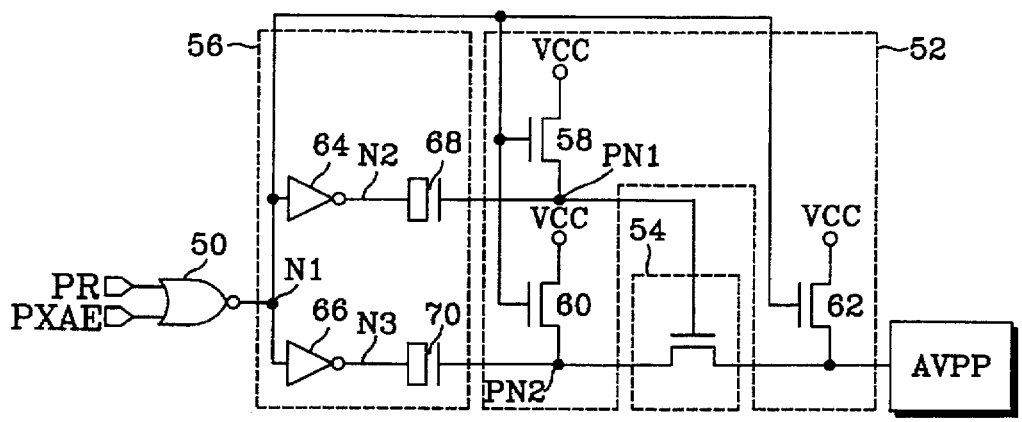
FIG. 4 is a diagram illustrating a boosting circuit according to the present invention.

FIG. 4 is a diagram illustrating a second boosting circuit according to the present invention, wherein the second boosting circuit boosts an external power supply voltage $V_{CC}$ in response to an input state of an external control signal, and outputs a second boosted voltage AVPP. FIG. 4 illustrates a booster 56, a transferror 54, and a precharger 52. The booster 56 boosts the external power supply voltage to the second boosted power supply voltage AVPP, in response to the active state of a row address strobe signal RASB which is input from external to the integrated circuit. The transferror 54 transfers the voltage of an internal node PN2 boosted by the booster 56 to a level of the second boosted power supply voltage AVPP. The precharger 52 precharges output nodes PN1 and PN2 and a boosted output node, and terminates the precharge operation in response to activation of the row address strobe signal RASB.

Figure 5:
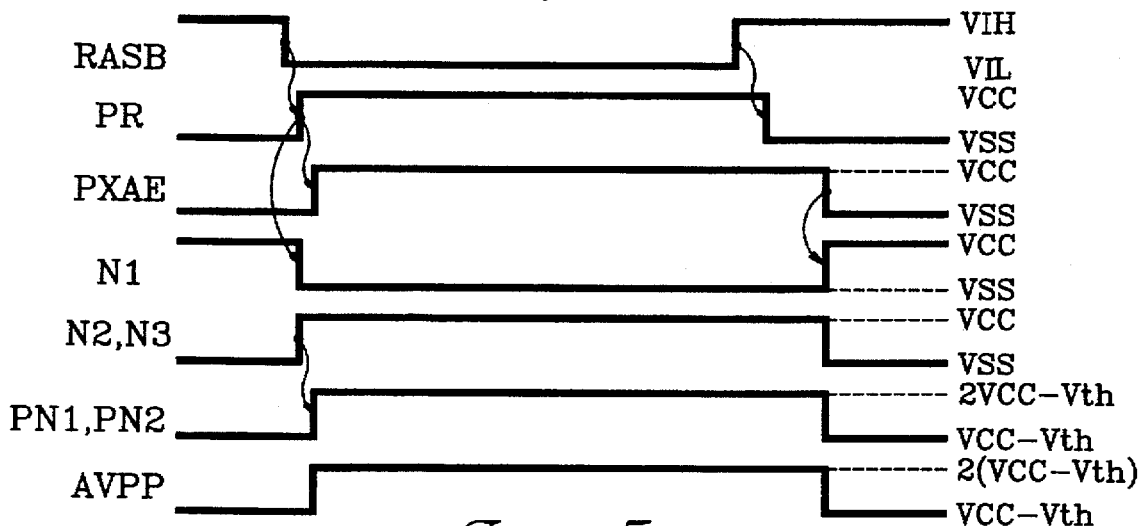
FIG. 5 is an operating timing diagram of the boosting circuit shown in FIG. 4.

FIG. 5 is an operating timing diagram of a second boosting circuit shown in FIG. 4. Referring to FIG. 5, the operation of FIG. 4 will now be explained.

As shown in FIG. 5, a clock PR and a row address enable signal PXAE output from a row address strobe input buffer (not shown), are all at logic "low" level in a precharge interval where the row address strobe RASB used for accessing data of the memory cell is inactive. The row address enable signal PXAE indicates that the row address is enabled when the row address enable signal PXAE changes to logic "high" level from logic "low" level. On the other hand, when the row address enable signal PXAE changes to logic "low" from logic "high" level, it indicates that the signal for controlling the word line and a control gate of the sense amplifier is inactive. Thus, in the logic "high" level (VIH level interval) where the row address strobe RASB is inactivated, a NOR gate 50 including the clock PR and the signal PXAE as inputs, provides a signal at the logic "high" level to the internal node N1 when the clock PR is activated to the logic "high" level after a predetermined time goes by, in response to activation of the row address strobe RASB.

The signal at the internal node N1 at the logic "high" level is provided to input terminals of inverters 64 and 66 within the booster 56. The inverters 64 and 66 reverse the input signals to the logic "low" level, and provide the signal at the logic "low" level to the nodes N2 and N3, respectively, which are connected to boost capacitors 68 and 70. The signal of the internal node N1 at the logic "high" level is applied to the gates of NMOS transistors 58 and 60 and to the gate of an NMOS transistor 62. The NMOS transistors 58 and 60 each have a drain terminal and a source terminal which is connected between the power supply voltage $V_{CC}$ and the first and second precharge nodes PN1 and PN2. The NMOS transistor 62 has a drain terminal and a source terminal which are connected to the power supply voltage $V_{CC}$ and the boosted output node.

Therefore, the NMOS transistors 58, 60, and 62 are turned on when the row address strobe signal RASB is at an inactive state (logic "high" level) and precharges the first and second precharge nodes PN1 and PN2 and the boosted output node to the level of $V_{CC}-V_{th}$", where voltage "$V_{th}$" is the threshold voltage of the NMOS transistors. As known, the internal nodes N2 and N3 connected to one terminal of the boost capacitors 68 and 70 are precharged to the level of ground voltage $V_{SS}$ (see FIG. 5). Also, the first and second precharge nodes PN1 and PN2 and the boosted output node are precharged to the level of the "$V_{CC}-V_{th}$", respectively (see FIG. 5).

As shown in FIG. 5, in order to access data in the memory cell, if the row address strobe RASB is activated to the logic "low" level, the clock PR output from the row address strobe signal input buffer changes to the logic "high" level. Thereafter, after a predetermined time goes by, the row address enable signal PXAE for enabling the row address buffer (not shown) is changed to the logic "high" level. Thus, the NOR gate 50 changes the level of the internal node N1 to the logic "low" level, in response to change of the clock PR to the logic "high" level. At that time, all of the NMOS transistors 58, 60, and 62 whose gates are connected to the internal node N1 are turned off.

The inverters 64 and 66, whose input terminals are connected to the internal node N1, reverse the signal of the logic "low" level output from the NOR gate 50, and then output the signal at the logic "high" level to the internal nodes N2 and N3, respectively. The signals of the internal nodes N2 and N3 at the logic "high" level are provided to one of the terminals of the boost capacitors 68 and 70, which were precharged to the level of the "$V_{CC}-V_{th}$". The other terminals of the boost capacitors 68 and 70 are connected to the precharge nodes PN1 and PN2. Therefore, the boost capacitors 68 and 70 boost the voltage levels of the first and second precharge nodes PN1 and PN2, which were precharged to the level of "$V_{CC}-V_{th}$" by the power supply voltage $V_{CC}$, to the level of "$2V_{CC-Vth}$", as shown in FIG. 5. The boosted voltage of "$2V_{CC-Vth}$" is provided to the gate and drain terminals of the NMOS transistor within the transferrer 54. The voltage level of the boosted output node is thereby boosted to 2 ($V_{CC}-V_{th}$), which is obtained by subtracting the threshold voltage of the transferrer 54 from the boosted voltage $2V_{CC-Vth}$.

In order to complete access to the data of the memory cell, when the row address strobe signal RASB changes to the logic "high" level, the clock PR output from the row address strobe signal input buffer (not shown) changes to the logic "low" level, as shown in FIG. 5. However, the row address enable signal PXAE from the row address strobe signal input buffer does not change to the logic "low" level immediately, in response to the input of the row address strobe signal RASB at the logic "high" level. Rather, the row address strobe signal PXAE generally changes to the logic "low" level when the signal for controlling the word line and the control gate of the sense amplifier is deactivated.

Accordingly, the boosting circuit of FIG. 4 according to the present invention continuously performs the boosting operation, and continuously outputs the boosted power supply voltage AVPP until the signal for controlling the word line and the control gate of the sense amplifier is deactivated, even though the row address strobe signal RASB changes to the logic "high" level from the logic "low" level. Then, if the control signal is deactivated and the signal PXAE thereby changes to the logic "low" level from the logic "high" level as shown in FIG. 5, the NOR gate 50 outputs a signal at logic "high" level to the internal node N1. When the voltage level of the internal node N1 changes to logic "high" level, all the NMOS transistors 58, 60, and 62 within the precharger 52 are turned on and the precharge operation is performed, thereby terminating the boosting operation.

As described above, a boosting circuit implemented according to the present invention boosts and outputs the external power supply voltage $V_{CC}$ as the second boosted power supply voltage AVPP, in response to activation of a control signal applied from external to the integrated circuit; i.e., a row address strobe signal RASB. It is possible to adjust the level of the boosted power supply voltage AVPP by regulating the threshold voltage of the NMOS transistors which charge or precharge the boost capacitors. The level of the second boosting circuit according to the present invention is preferably the same as, or higher than that of, the boosted power supply voltage VPP output from the boosting circuit of FIG. 1.

Figure 3:
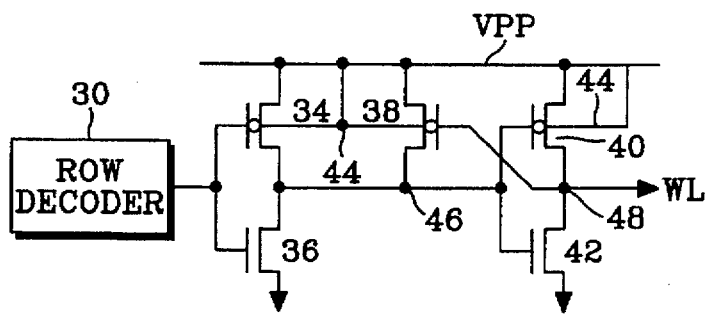
FIG. 3 is a circuit diagram of a word line driver operated by a boosted power supply voltage output from a boosting circuit of FIG. 1.
Figure 6:
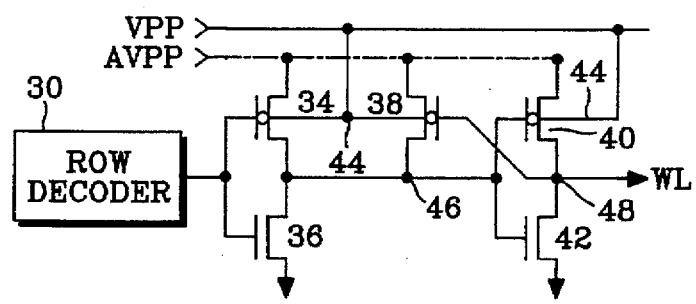
FIG. 6 is a diagram illustrating a word line driver operated by a boosting voltage output from a boosting circuit according to the present invention.

A boosting circuit of the present invention as illustrated in FIG. 4 can be used to operate peripheral circuits of an integrated circuit memory device, together with a boosting circuit illustrated in FIG. 3, as illustrated in FIG. 6. In explaining FIG. 6, a boosting circuit having a configuration shown in FIG. 1 will be referred to as a first boosting circuit and a boosting circuit having the configuration shown in FIG. 4 will be referred to as a second boosting circuit.

FIG. 6 is a diagram illustrating a word line driver of FIG. 3 operated by boosted voltage outputs from a boosting circuit according to the present invention. In the configuration of the word line driver of FIG. 6, like components are indicated by like reference numbers.

Referring to FIG. 6, the first boosted power supply voltage VPP from the first boosting circuit is provided to the bulk bias terminals 44 of the first to third PMOS transistors 34, 38, and 40 of the word line driver. The second boosted power supply voltage AVPP from the second boosting circuit is provided to the source terminals of the PMOS transistors 34, 38, and 40.

When the external power supply voltage $V_{CC}$ is provided to the semiconductor memory device, the oscillator of the first boosting circuit operates to generate the first boosted power supply voltage VPP as described above. The boosted power supply voltage VPP is applied to the bulk bias terminals 44 of the first to third PMOS transistors 34, 38, and 40 of the word line driver, as shown in FIG. 6. The precharge voltage "$V_{CC}-V_{th}$" output from the second boosting circuit is applied to the source terminals of the first to third PMOS transistors 34, 38, and 40 during the standby mode where the data of the memory cell is not accessed.

When the row address strobe signal RASB is activated, the second boosting circuit, as described above, provides the second boosted power supply voltage AVPP to the source terminals of the PMOS transistors 34, 38, and 40. Accordingly, the word line driver shown in FIG. 6 uses the first boosted power supply voltage VPP and the second boosted power supply voltage AVPP as operating voltages. When a decoding signal is output from the row decoder 30, as discussed above, the decoding signal enables the word line WL to the level of the second boosted power supply voltage AVPP.

Accordingly, when the semiconductor memory device is in the standby mode, only one line which is operated as a well bias of the PMOS transistors 34, 38, and 40 formed in an N-type well in a P-type substrate, has the level of the first boosted power supply voltage VPP. Even though a bridge between the source terminals of the PMOS transistors 34, 38, and 40 and another source terminal at a different level may occur, oscillation and boosting operations are not executed within the boosting circuit and the current consumption may be reduced during the standby mode, to thereby improve the yield in the semiconductor memory device. In addition, the second boosting circuit of FIG. 6 provides the voltages to the source terminals of the PMOS transistors 34, 38, and 40 of the word line driver during the active cycle when the data of the memory cell is accessed. Improper access can be reduced by boosting the voltage level of the word line of the memory cell which is initially accessed to the boosted power supply voltage VPP.

While only a word line driver is described in the above embodiment of the present invention, various modifications can be implemented within the spirit and the scope of the present invention. For example, the present invention may be applied to all the circuits which use the boosted power supply voltage VPP which is output from the first boosting circuit to the source terminal of the PMOS transistor. Therefore, the present invention should not be limited to only a word line driver.

According to the present invention, a first boosted power supply voltage VPP, higher than the external power supply voltage, is provided to the bulk bias terminal of the PMOS transistor disposed within the peripheral circuit. A second boosted power supply voltage AVPP is applied to the source terminal of the PMOS transistor. Thereby, it is possible to prevent the reduction in yield due to leakage current during the standby mode of a semiconductor memory device, and to prevent the improper access operation thereof.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. An integrated circuit comprising:
    a plurality of integrated circuit transistors;
    means for providing a power supply voltage to at least one of said integrated circuit transistors;
    first means for boosting said power supply voltage to a first boosted voltage and for applying said first boosted voltage to at least one of said integrated circuit transistors; and
    second means for boosting said power supply voltage to a second boosted voltage, and for applying said second boosted voltage to at least one of said integrated circuit transistors, such that said integrated circuit transistors operate with said power supply voltage, said first boosted voltage and said second boosted voltage;;
    wherein said second boosted voltage is greater than said first boosted voltage.

2. An integrated circuit according to claim
    wherein said first boosting means is responsive to application of said power supply voltage to said integrated circuit, such that said first boosted voltage is generated upon application of said power supply voltage to said integrated circuit; and
    wherein said second boosting means is responsive to application of said power supply voltage to said integrated circuit and to an enable signal, such that said second boosted voltage is only generated upon application of said power supply voltage and said enable signal to said integrated circuit.

3. An integrated circuit comprising:

a plurality of integrated circuit transistors;

means for providing a power supply voltage to at least one of said integrated circuit transistors;

first means for boosting said power supply voltage to a first boosted voltage and for applying said first boosted voltage to at least one of said integrated circuit transistors; and second means for boosting said power supply voltage to a second boosted voltage, and for applying said second boosted voltage to at least one of said integrated circuit transistors, such that said integrated circuit transistors operate with said power supply voltage, said first boosted voltage and said second boosted voltage;

wherein said plurality of integrated circuit transistors include at least one PMOS transistor including a source region and a bulk region;

wherein said first boosting means applies said first boosted voltage to said bulk region; and wherein said second boosting means applies said second boosted voltage to said source region.

4. An integrated circuit according to claim 1 wherein said first boosting means includes a capacitor and wherein said second boosting means includes a pair of capacitors.

5. An integrated circuit comprising:

a plurality of integrated circuit transistors;

means for providing a power supply voltage to at least one of said integrated circuit transistors;

first means for boosting said power supply voltage to a first boosted voltage and for applying said first boosted voltage to at least one of said integrated circuit transistors; and second means for boosting said power supply voltage to a second boosted voltage, and for applying said second boosted voltage to at least one of said integrated circuit transistors, such that said integrated circuit transistors operate with said power supply voltage, said first boosted voltage and said second boosted voltage;

wherein said second boosting means comprises:

a first field effect transistor;

a second field effect transistor;

a first capacitor; and a second capacitor;

wherein said first field effect transistor is serially connected between said power supply voltage and said first capacitor; and wherein said second field effect transistor is serially connected between said power supply voltage and said second capacitor.

6. An integrated circuit according to claim 5, wherein said first field effect transistor and said first capacitor define a first node therebetween and wherein said second field effect transistor and said second capacitor define a second node therebetween, said integrated circuit further comprising:

a third field effect transistor having a controlling electrode and a pair of controlled electrodes, said controlling electrode being connected to said first node, one of said controlled electrodes being connected to said second node, and the other of said controlled electrodes producing said second boosted voltage.

7. An integrated circuit according to claim 1:

wherein said plurality of integrated circuit transistors form a plurality of memory cells and a word line driver;

wherein said power supply voltage is supplied to said plurality of memory cells; and wherein said first and second boosted voltages are supplied to said word line driver.

8. An integrated circuit comprising:

a plurality of integrated circuit transistors;

means for providing a power supply voltage to at least one of said integrated circuit transistors;

first means for boosting said power supply voltage to a first boosted voltage and for applying said first boosted voltage to at least one of said integrated circuit transistors: and second means for boosting said power supply voltage to a second boosted voltage, and for applying said second boosted voltage to at least one of said integrated circuit transistors, such that said integrated circuit transistors operate with said power supply voltage, said first boosted voltage and said second boosted voltage;

wherein said plurality of integrated circuit transistors form a plurality of memory cells and a word line driver;

wherein said power supply voltage is supplied to said plurality of memory cells;

wherein said first and second boosted voltages are supplied to said word line driver;

wherein said word line driver includes a plurality of NMOS transistors and a plurality of PMOS transistors, said PMOS transistors each including a source region and a bulk region;

wherein said first boosting means applies said first boosted voltage to said bulk regions; and wherein said second boosting means applies said second boosted voltage to said source regions.

9. An integrated circuit memory comprising:

a plurality of memory cells;

means for providing a power supply voltage to said plurality of memory cells;

a peripheral circuit;

first means for boosting said power supply voltage to a first boosted voltage and for applying said first boosted voltage to said peripheral circuit; and second means for boosting said power supply voltage to a second boosted voltage, and for applying said second boosted voltage to said peripheral circuit.

10. An integrated circuit memory according to claim 9:

wherein said first boosting means is responsive to application of said power supply voltage to said integrated circuit, such that said first boosted voltage is generated upon application of said power supply voltage to said integrated circuit; and wherein said second boosting means is responsive to application of said power supply voltage to said integrated circuit and to a row address strobe signal, such that said second boosted voltage is only generated upon application of said power supply voltage and said row address strobe signal to said integrated circuit.

11. An integrated circuit memory according to claim 9 wherein said second boosted voltage is equal to or greater than said first boosted voltage.

12. An integrated circuit memory according to claim 10:

wherein said peripheral circuit includes at least one PMOS transistor including a source region and a bulk region;

wherein said first boosting means applies said first boosted voltage to said bulk region; and wherein said second boosting means applies said second boosted voltage to said source region in response to said row address strobe signal.

13. An integrated circuit memory according to claim 12 wherein said peripheral circuit is a word line driver.

14. An integrated circuit memory according to claim 9 wherein said first boosting means includes a capacitor and wherein said second boosting means includes a pair of capacitors.

15. An integrated circuit memory according to claim 9 wherein said second boosting means comprises:

a first field effect transistor;

a second field effect transistor;

a first capacitor; and a second capacitor;

wherein said first field effect transistor is serially connected between said predetermined power supply voltage and said first capacitor; and wherein said second field effect transistor is serially connected between said predetermined power supply voltage and said second capacitor.

16. An integrated circuit memory according to claim 15, wherein said first field effect transistor and said first capacitor define a first node therebetween and wherein said second field effect transistor and said second capacitor define a second node therebetween, said integrated circuit further comprising:

a third field effect transistor having a controlling electrode and a pair of controlled electrodes, said controlling electrode being connected to said first node, one of said controlled electrodes being connected to said second node, and the other of said controlled electrodes producing said second boosted voltage.

17. A method of operating an integrated circuit having a plurality of PMOS transistors thereon comprising the steps of:

applying a power supply voltage to said integrated circuit;

generating a first boosted voltage in said integrated circuit in response to application of said power supply voltage thereto;

applying the first boosted voltage to the bulk regions of at least some of said PMOS transistors;

generating a second boosted voltage in said integrated circuit in response to an enable signal; and applying the second boosted voltage to the sources of at least some of said PMOS transistors.

18. A method according to claim 17 wherein said integrated circuit is an integrated circuit memory device, wherein said plurality of PMOS transistors form a word line driver for the memory device and wherein said step of generating a second boosted voltage comprises the step of generating a second boosted voltage in said integrated circuit memory device in response to a row address strobe signal.

19. A method according to claim 17 wherein said step of generating a second boosted voltage comprises the step of generating a second boosted voltage which is equal to or greater than said first boosted voltage.

20. An integrated circuit according to claim 3 wherein said second boosted voltage is greater than said first boosted voltage.

21. An integrated circuit according to claim 5 wherein said second boosted voltage is greater than said first boosted voltage.

22. An integrated circuit according to claim 8 wherein said second boosted voltage is greater than said first boosted voltage.

23. An integrated circuit according to claim 9 wherein said second boosted voltage is greater than first boosted voltage.

* * * * *